(12) United States Patent
Kim et al.

(10) Patent No.: US 10,438,989 B2
(45) Date of Patent: Oct. 8, 2019

(54) STACK-TYPE IMAGE SENSOR

(71) Applicant: SK hynix Inc., Gyeonggi-do (KR)

(72) Inventors: Yeounsoo Kim, Chungcheongbuk-do (KR); Donghyun Woo, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 147 days.

(21) Appl. No.: 15/801,418

(22) Filed: Nov. 2, 2017

(65) Prior Publication Data

US 2018/0308895 A1 Oct. 25, 2018

(30) Foreign Application Priority Data

Apr. 24, 2017 (KR) .................. 10-2017-0052227

(51) Int. Cl.
| | | |
|---|---|---|
| *H01L 27/148* | (2006.01) | |
| *H01L 31/02* | (2006.01) | |
| *H01L 27/146* | (2006.01) | |
| *H01L 31/0232* | (2014.01) | |
| *H04N 5/00* | (2011.01) | |
| *H04N 5/369* | (2011.01) | |

(52) U.S. Cl.
CPC ...... *H01L 27/14806* (2013.01); *H01L 27/146* (2013.01); *H01L 27/14603* (2013.01); *H01L 27/14612* (2013.01); *H01L 27/14634* (2013.01); *H01L 27/14636* (2013.01); *H01L 31/02* (2013.01); *H01L 31/0232* (2013.01); *H01L 27/1464* (2013.01); *H04N 5/379* (2018.08)

(58) Field of Classification Search
CPC . H01L 27/14806; H01L 31/02; H01L 27/146; H01L 31/0232; H01L 27/14612; H01L 27/14634; H01L 27/14636; H01L 27/14603; H01L 27/1464; H04N 5/379
USPC ........................................................ 250/208.1
See application file for complete search history.

(56) References Cited

U.S. PATENT DOCUMENTS

| | | | | |
|---|---|---|---|---|
| 8,773,562 | B1 * | 7/2014 | Fan ................... | H01L 27/14643 348/308 |
| 9,564,464 | B2 * | 2/2017 | Madurawe ........ | H01L 27/14634 |
| 2010/0079640 | A1 | 4/2010 | Hwang | |

FOREIGN PATENT DOCUMENTS

KR     1020100079084     7/2010

* cited by examiner

*Primary Examiner* — Seung C Sohn
(74) *Attorney, Agent, or Firm* — IP & T Group LLP

(57) ABSTRACT

A stack-type image sensor include a first substrate comprising a photoelectric conversion element and a storage transistor connecting the photoelectric conversion element to a charge storage element; and a second substrate comprising a transfer transistor connecting the charge storage element to a floating diffusion, wherein the first substrate and the second substrate are stacked. The charge storage element comprises: a first electrode and a second electrode positioned adjacent to the first electrode and having a sidewall facing a sidewall of the first electrode, wherein the first electrodes and the second electrodes comprise at least one bonding pad formed in the first or second substrate; and a dielectric layer inserted between the sidewall of the first electrode and the sidewall of the second electrode, which face each other.

20 Claims, 7 Drawing Sheets

STACK-TYPE IMAGE SENSOR

CROSS-REFERENCE TO RELATED APPLICATIONS

This application claims priority under 35 U.S.C. § 119 to Korean Patent Application No. 10-2017-0052227, filed on Apr. 24, 2017, in the Korean Intellectual Property Office, the disclosure of which is incorporated herein by reference in its entirety.

TECHNICAL FIELD

Various embodiments relate to a semiconductor device fabrication technology, and more particularly, to a stack-type image sensor.

DISCUSSION OF THE RELATED ART

An image sensor is a device which converts an optical image into an electrical signal. Recently, with the development of the computer industry and communication industry, the demand for an image sensor having improved performance is increasing in various fields such as a digital camera, a camcorder, a personal communication system (PCS), a game machine, a security camera, a medical micro-camera, and a robot.

SUMMARY

Various embodiments are directed to an enhanced stack-type image sensor having a charge storage element for a global shutter function, capable of providing sufficient capacitance without increasing an area thereof.

In an embodiment, a stack-type image sensor may include: a first substrate comprising a photoelectric conversion element and a storage transistor connecting the photoelectric conversion element to a charge storage element; and a second substrate comprising a transfer transistor connecting the charge storage element to a floating diffusion, wherein the first substrate and the second substrate are stacked. The charge storage element may include: a first electrode and a second electrode positioned adjacent to the first electrode and having a sidewall facing a sidewall of the first electrode, wherein the first electrodes and the second electrodes comprise at least one bonding pad formed in the first or second substrate; and a dielectric layer inserted between the sidewall of the first electrode and the sidewall of the second electrode, which face each other.

The first electrode may be formed each of the first and second substrates, and comprises bonding pads that are in contact with each other. The bonding pads that are in contact with each other may have substantially the same planar shape. The second electrode may have a ground potential. The second electrode may include a bonding pad formed in the first substrate or a bonding pad formed in the second substrate. The second electrode may be formed in each of the first and second substrates, and comprises bonding pads that are in contact with each other. The bonding pads that are in contact with each other may have different planar shapes.

In an embodiment, a stack-type image sensor may include: a first substrate including a first semiconductor substrate including a photoelectric conversion element, a first interlayer dielectric layer formed over the first semiconductor substrate, a first bonding pad formed in the first interlayer dielectric layer and connected to the photoelectric conversion element through a storage transistor, and a second bonding pad formed in the first interlayer dielectric layer and positioned adjacent to the first bonding pad; and a second substrate including a second semiconductor substrate, a second interlayer dielectric layer formed over the second semiconductor substrate, and a third bonding pad formed in the second interlayer dielectric layer and connected to a floating diffusion through a transfer transistor. The first and second substrates may be stacked and bonded to each other such that the first and third bonding pads are in contact with each other.

Furthermore, the stack-type image sensor may further include: a fourth bonding pad formed in the second interlayer dielectric layer of the second substrate and being in contact with the second bonding pad. The fourth bonding pad may be positioned adjacent to the third bonding pad, the third and fourth bonding pads may be positioned at the same level in a direction vertical to a stacked structure of the first and second substrates, and the fourth bonding pad may have a sidewall facing a sidewall of the third bonding pad in a direction horizontal to the stacked structure of the first and second substrates. The fourth bonding pad may surround a part of the sidewalls of the third bonding pad, or may surround the whole sidewalls of the third bonding pad. The second interlayer dielectric layer may be inserted between the sidewall of the third bonding pad and the sidewall of the fourth bonding pad, which face each other. The fourth bonding pad may have a ground potential. The second and fourth bonding pads may have different planar shapes.

The first and second bonding pads may be positioned at the same level in a direction vertical to a stacked structure of the first and second substrates, and the second bonding pad may have a sidewall facing a sidewall of the first bonding pad in a direction horizontal to the stacked structure of the first and second substrates. The first interlayer dielectric layer may be inserted between a sidewall of the first bonding pad and a sidewall of the second bonding pad, which face each other. The second bonding pad may have a ground potential. The second bonding pad may surround a part of sidewalls of the first bonding pad, or may surround the whole sidewalls of the first bonding pad. The first and third bonding pads may have the same planar shape.

Furthermore, the stack-type image sensor may further include: a bonding insulating layer formed over a bonding surface between the first and second substrates, wherein the first and third bonding pads may be electrically connected through the bonding insulating layer.

DETAILED DESCRIPTION

Figure 1:
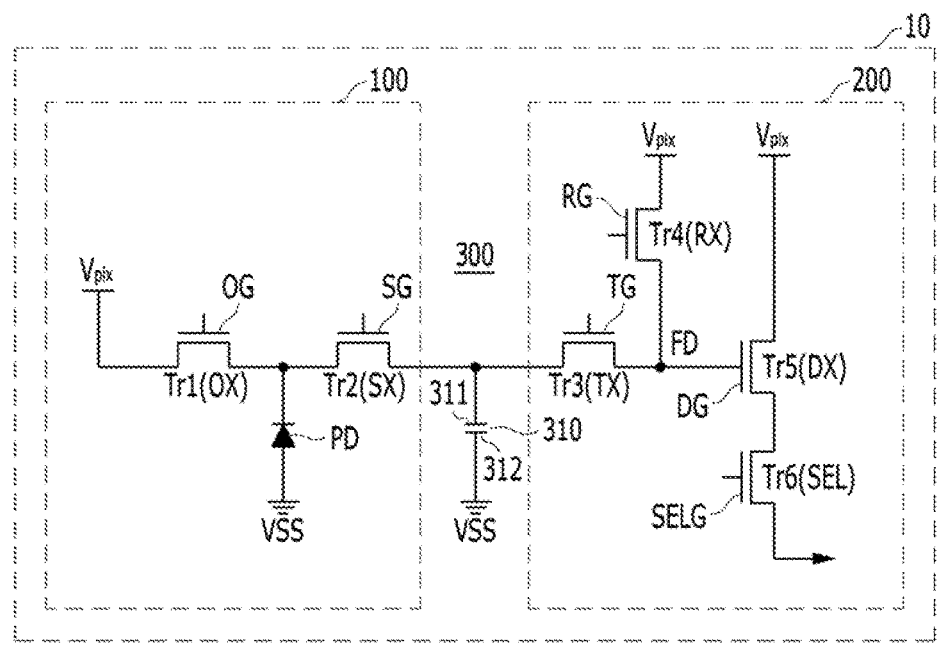
FIG. 1 is an equivalent circuit diagram illustrating a unit pixel with a global shutter function in stack-type image sensors, according to an embodiment of the present invention.

Various embodiments will be described below in more detail with reference to the accompanying drawings. The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that, particular multilayer structure (e.g. one or more additional layers may be present between two illustrated layers). As a specific example, when a first layer in a described or illustrated multi-layer structure is referred to as being "on" or "over" a second layer, the first layer may be directly formed on the second layer but may also represent a structure where one or more other intermediate layers may exist between the first layer and the second layer.

Various embodiments provide an enhanced stack-type image sensor. The stack-type image sensor according to the embodiment of the present invention may have a global shutter function. For this function, each of unit pixels in the stack-type image sensor may include a charge storage element for the global shutter function. The enhanced stack-type image sensor can provide the charge storage element for the global shutter function without increasing the area, and the charge storage element can provide sufficient capacitance required for the global shutter function. For this operation, the stack-type image sensor according to the embodiment of the present invention may have a structure in which two or more substrates are stacked and include the charge storage element that is implemented by using bonding pads, which electrically couple the substrates. Specifically, the charge storage element may include a first electrode, a second electrode positioned adjacent to the first electrode and having a sidewall facing a sidewall of the first electrode, and a dielectric layer inserted between the sidewall of the first electrode and the sidewall of the second electrode. Each of the first and second electrodes may include a bonding pad.

Figure 2:
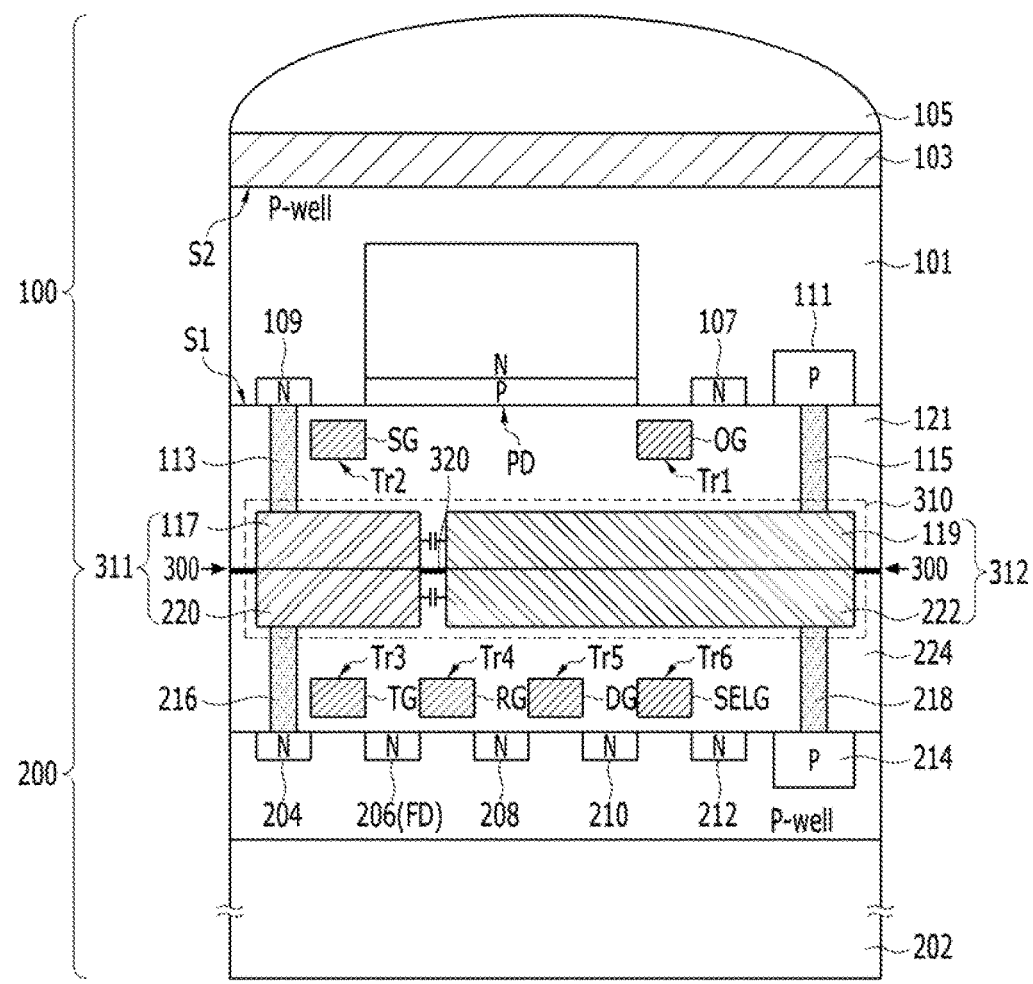
FIG. 2 is a cross-sectional view illustrating the unit pixel of the stack-type image sensor of FIG. 1, according to a first embodiment of the present invention.

FIG. 1 is an equivalent circuit diagram illustrating a unit pixel with a global shutter function in a stack-type image sensor, according to an embodiment of the present invention. FIG. 2 is a cross-sectional view illustrating the unit pixel of the stack-type image sensor of FIG. 1, according to a first embodiment of the present invention.

As illustrated in FIGS. 1 and 2, the stack-type image sensor according to the first embodiment may be formed by a bonding between first and second substrates 100 and 200. That is, the stack-type image sensor may have a structure in which the first and second substrates 100 and 200 are stacked. The stack-type image sensor may have a bonding insulating layer 320 formed on a bonding surface 300 between the first and second substrates 100 and 200. The bonding insulating layer 320 may increase an adhesive force between the first and second substrates 100 and 200. The first and second substrates 100 and 200 may be electrically coupled to each other. The bonding between the first and second substrates 100 and 200 may include a hybrid bonding. In FIG. 1, a charge storage element 310 for the global shutter function may be positioned at the bonding surface 300 between the first and second substrates 100 and 200.

In the stack-type image sensor according to the first embodiment, the first substrate 100 may include a first semiconductor substrate 101 and a photoelectric conversion element D. The first semiconductor substrate 101 may have a first surface S1 and a second surface S2 facing the first surface S1, and the photoelectric conversion element PD may be formed in the first semiconductor substrate 101.

The first semiconductor substrate 101 may have a single crystal state, and include a silicon containing material. That is, the first semiconductor substrate 101 may include a single-crystal silicon containing material. The first semiconductor substrate 101 may include a substrate thinned through a thinning process. As the first semiconductor substrate 101 is thinned, the first substrate 100 may have a structure in which a P-well is formed across the entire first semiconductor substrate 101. The first surface S1 of the first semiconductor substrate 101 may be set to the front side, and the second surface S2 thereof may be set to the back side or a light receiving surface of the photoelectric conversion element PD.

The photoelectric conversion element PD may generate and store a photo charge in response to incident light, and include a photo diode. Specifically, the photoelectric conversion element PD may have a structure in which P-type and N-type impurity regions having different conductive types vertically overlap each other. The P-type impurity region may be in contact with the first surface S1 of the first semiconductor substrate 101, and the N-type impurity region may be separated from the second surface S2 of the first semiconductor substrate 101. Although the photoelectric conversion element PD includes the photo diode in the first embodiment, the present embodiments are not limited thereto. The photoelectric conversion element PD may include a photo transistor, a photo gate, a pinned photo diode (PPD), or a combinations thereof, in addition to the photo diode.

In the stack-type image sensor according to the first embodiment, the first substrate 100 may include first and second transistors Tr1 and Tr2 coupled to the photoelectric conversion element PD. The first transistor Tr1 may serve as an overflow transistor OX, and the second transistor Tr2 may serve as a storage transistor SX. The first and second transistors Tr1 and Tr2 may include NMOS transistors.

The first transistor Tr1, i.e., the overflow transistor OX, may be connected between a pixel voltage Vpix and the photoelectric conversion element PD. The overflow transistor OX may be used to prevent photo charges, generated by the photoelectric conversion element PD, from overflowing to the charge storage element 310. For example, when the intensity of light incident on the unit pixel 10 is higher than a reference or when photo charges generated during times other than an integration time are accumulated in the photoelectric conversion element PD, the overflow transistor OX may be used to prevent photo charges that are generated by the photoelectric conversion element PD (for example, electrons) from overflowing to the charge storage element 310. Also, the overflow transistor OX may be used to remove (or reset) the photo charges accumulated in the photoelectric conversion element PD immediately before the integration time. The overflow transistor OX may include an overflow gate OG formed on the first surface S1 of the first semiconductor substrate 101. On the other hand, the overflow gate OG has a structure in which a gate insulating layer and a gate electrode are sequentially stacked, and the gate insulating layer is not shown in FIG. 2. A first impurity region 107 may be formed in the first semiconductor substrate 101. The conductive type of the first impurity region 107 may be set to the N-type and the pixel voltage Vpix may be applied to the first impurity region 107. The pixel voltage Vpix may be equal to or less than a supply voltage VDD. The photoelectric conversion element PD and the first impurity region 107, positioned at both sides of the overflow gate OG, may serve as the source and drain of the overflow transistor OX, respectively.

The second transistor Tr2, i.e., the storage transistor SX, may be connected between the photoelectric conversion element PD and the charge storage element 310. The photo charges transmitted from the photoelectric conversion element PD may be stored in the charge storage element 310 through the storage transistor SX. The storage transistor SX may include a storage gate SG formed on the first surface S1 of the first semiconductor substrate 101. On the other hand the storage gate SG has a structure in which a gate insulating layer and a gate electrode are sequentially stacked, and the gate insulating layer is not shown in FIG. 2. A second impurity region 109 may be formed in the first semiconductor substrate 101. The second impurity region 109 may be set to the N-type, and the second impurity region 109 may be connected to the charge storage element 310. The second impurity region 109 and the photoelectric conversion element PD, positioned at both sides of the storage gate SG, may serve as the source and drain of the storage transistor SX, respectively.

In the stack-type image sensor according to the first embodiment, the first substrate 100 may further include a third impurity region 111 formed in the first semiconductor substrate 101, a first interlayer dielectric layer 121 formed on the first surface S1 of the first semiconductor substrate 101, a first bonding pad 117 formed in the first interlayer dielectric layer 121 and connected to the second impurity region 109 of the second transistor Tr2 through a first plug 113, and a second bonding pad 119 formed in the first interlayer dielectric layer 121 and connected to the third impurity region 111 through a second plug 115. Furthermore, the charge storage element 310 formed in the first substrate 100 may include a first bonding pad 117 that may serve as a first electrode 311, a second bonding pad 119 that may serve as a second electrode 312, and an interlayer dielectric layer 121 that may serve as a dielectric layer. That is, in the first embodiment, the charge storage element 310 formed in the first substrate 100 may include the first bonding pad 117, the second bonding pad 119, and the first interlayer dielectric layer 121, all of which are formed in the stack-type image sensor. Therefore, the charge storage element 310 for the global shutter function can be provided without increasing the area.

The third impurity region 111 may provide a ground potential or ground voltage VSS. Therefore, the third impurity region 111 formed in the P-well may be set to the P-type, and the third impurity region 111 may have a higher impurity doping concentration than the P-well. In the first embodiment, although the third impurity region 111 serves to provide the ground potential, the present embodiment is not limited thereto. For example, although not illustrated, the second bonding pad 119 may have the ground potential through a metal line, which is formed in the interlayer dielectric layer 121 and electrically coupled to the second plug 115.

The first interlayer dielectric layer 121 may include a plurality of insulating layers stacked therein. The first interlayer dielectric layer 121 may include one or more of oxide, nitride, oxynitride, and combinations thereof. Although not illustrated, the first interlayer dielectric layer 121 may include a plurality of metal lines and a plurality of plugs therein. The first interlayer dielectric layer 121 positioned between the first and second bonding pads 117 and 119, for example, between a sidewall of the first bonding pad 117 and a sidewall of the second bonding pad 119, which face each other, may serve as the dielectric layer of the charge storage element 310.

The charge storage element 310 formed in the first substrate 100 may include the first and second bonding pads 117 and 119 respectively corresponding to the first and second electrodes 311 and 312. The first bonding pad 117 may electrically couple the second transistor Tr2 formed in the first substrate 100 to a third transistor Tr3 formed in the second substrate 200, and simultaneously serve as the first electrode 311 of the charge storage element 310. The second bonding pad 119 may be positioned at the same level as the first bonding pad 117 in a direction vertical to a stacked structure of the first and second substrates 100 and 200 (hereinafter, referred to as a "vertical direction"). The surface of the first bonding pad 117, the surface of the second bonding pad 119, and the surface of the first interlayer dielectric layer 121, which is positioned between the first and second bonding pads 117 and 119, may be positioned at the same level in the vertical direction. The second bonding pad 119 may serve as the second electrode 312 of the charge storage element 310, and have the ground potential as the second bonding pad 119 is connected to the third impurity region 111 through the second plug 115. As such, the charge storage element 310 may be formed in the first substrate 100 using capacitance generated between the first bonding pad 117 and the second bonding pad 119 positioned adjacent to the first bonding pad 117 in a direction horizontal to the stacked structure of the first and second substrates 100 and 200 (hereinafter, referred to as a "horizontal direction"). Thus, the capacitance of the charge storage element 310 can be controlled depending on the area where the sidewall of the first bonding pad 117 and the sidewall of the second bonding pad 119 face each other. Therefore, the charge storage element 310 in the present embodiment can easily provide sufficient capacitance required for the global shutter function. The first and second bonding pads 117 and 119 may have various planar shapes which will be described later with reference to FIGS. 3A to 3C.

The first substrate 100 of the stack-type image sensor according to the first embodiment may further include a color separation element 103 formed on the second surface S2 of the first semiconductor substrate 101 and a light focusing element 105 formed on the color separation element 103. The color separation element 103 may include a color filter, which may include a red filter, green filter, blue filter, cyan filter, yellow filter, magenta filter, white filter, black filter, IR cutoff filter, and the like. The light focusing element 105 may include a digital lens or hemispherical lens.

In the stack-type image sensor according to the first embodiment, the second substrate 200 may include a second semiconductor substrate 202, a P-well formed in the second semiconductor substrate 202, and third to sixth transistors Tr3 to Tr6. The third transistor Tr3 may serve as a transfer transistor TX. The fourth transistor Tr4 may serve as a reset transistor RX. The fifth transistor Tr5 may serve as, a driver transistor DX. The sixth transistor Tr6 may serve as a selection transistor SEL.

The second semiconductor substrate 202 may have a single crystal state, and include a silicon containing material. That is, the second semiconductor substrate 202 may include a single-crystal silicon containing material. For example, the second semiconductor substrate 202 may include a bulk silicon substrate. The P-well formed in the second semiconductor substrate 202 may provide a base for the third to sixth transistors Tr3 to Tr6. Therefore, the third to sixth transistors Tr3 to Tr6 may include NMOS transistors.

The third transistor Tr3, i.e., the transfer transistor TX may be connected between the charge storage element 310 and a floating diffusion FD. The charges formed in the photoelectric conversion element PD may be stored into the floating diffusion FD through the transfer transistor TX. The transfer transistor TX may include a transfer gate TG formed on the second semiconductor substrate 202, and fourth and fifth impurity regions 204 and 206 formed in the second semiconductor substrate 202 at both sides of the transfer gate TG. On the other hand, the transfer gate TG has a structure in which a gate insulating layer and a gate electrode are sequentially stacked, and the gate insulating layer is not shown in FIG. 2. The fourth and fifth impurity regions 204 and 205 may be set to the N-type. The fourth impurity region 204 may be connected to the charge storage element 310. The fifth impurity region 206 may serve as the floating diffusion FD, and be connected to the fourth and fifth transistors Tr4 and Tr5.

The fourth transistor Tr4, i.e., the reset transistor RX, may be connected between the pixel voltage Vpix and the floating diffusion FD. The voltage level of the floating diffusion FD may be reset to the pixel voltage Vpix by the reset transistor RX. The pixel voltage Vpix may be equal to or less than the supply voltage VDD. The reset transistor RX may include a reset gate RG formed on the second semiconductor substrate 202, and fifth and sixth impurity regions 206 and 208 formed in the second semiconductor substrate 202 at both sides of the reset gate RG. On the other hand, the reset gate RG has a structure in which a gate insulating layer and a gate electrode are sequentially stacked, and the gate insulating layer is not shown in FIG. 2. The fifth and sixth impurity regions 206 and 208 may be set to the N-type. The fifth impurity region 206 may serve as the floating diffusion FD, and the pixel voltage Vpix may be applied to the sixth impurity region 208.

The fifth transistor Tr5, i.e., the driver transistor DX, may be connected between the pixel voltage Vpix and the selection transistor SEL, and operate based on a voltage level that is set according to the charges of the floating diffusion FD. The driver transistor DX may include a driver gate DG formed on the second semiconductor substrate 202, and sixth and seventh impurity regions 208 and 210 formed in the second semiconductor substrate 202 at both sides of the driver gate DG. On the other hand, the driver gate DG has a structure in which a gate insulating layer and a gate electrode are sequentially stacked, and the gate insulating layer is not shown in FIG. 2. The sixth and seventh impurity regions 208 and 210 may be set to the N-type. The pixel voltage Vpix may be applied to the sixth impurity region 208, and the driver gate DG may be connected to the fifth impurity region 206 serving as the floating diffusion FD.

The sixth transistor Tr6, i.e., the selection transistor SEL, may output an output signal of the driver transistor DX, for example, a pixel signal to a column line (not illustrated). The selection transistor SEL may include a selection gate SELG formed on the second semiconductor substrate 202, and seventh and eighth impurity regions 210 and 212 formed in the second semiconductor substrate 202 at both sides of the selection gate SELG. On the other hand, the selection gate SELG has a structure in which a gate insulating layer and a gate electrode are sequentially stacked, and the gate insulating layer is not shown in FIG. 2. The seventh and eighth impurity regions 210 and 212 may be set to the N-type. The eighth impurity region 212 may be connected to the column line (not illustrated).

In the stack-type image sensor according to the first embodiment, the second substrate 200 may further include a ninth impurity region 214 formed in the second semiconductor substrate 202, a second interlayer dielectric layer 224 formed on the second semiconductor substrate 202, a third bonding pad 220 formed in the second interlayer dielectric layer 224 and connected to the fourth impurity region 204 of the third transistor Tr3 through a third plug 216, and a fourth bonding pad 222 formed in the second interlayer dielectric layer 224 and connected to the ninth impurity region 214 through a fourth plug 218. Furthermore, the charge storage element 310 formed in the second substrate 200 may include the third bonding pad 220 that may serve as the first electrode 311, the fourth bonding pad 222 that may serve as the second electrode 312, and the second interlayer dielectric layer 224 that may serve as the dielectric layer. Since the charge storage element 310 formed in the second substrate 200 includes the third bonding pad 220, the fourth bonding pad 222, and the second interlayer dielectric layer 224, all of which are formed in the stack-type image sensor, the charge storage element 310 for the global shutter function can be provided without increasing the area.

The ninth impurity region 214 may provide the ground potential or ground voltage VSS. Therefore, the ninth impurity region 214 formed in the P-well may be set to the P-type, and have a higher impurity doping concentration than the P-well. In the first embodiment, although the ninth impurity region 214 serves to provide the ground potential, the present embodiment is not limited thereto. For example, although not illustrated, the fourth bonding pad 222 may have the ground potential through a metal line which is formed in the second interlayer dielectric layer 224 and electrically connected to the fourth plug 218.

The second interlayer dielectric layer 224 may include a plurality of insulating layers stacked therein. The second interlayer dielectric layer 224 may include one or more of oxide, nitride, oxynitride, and combinations thereof. Although not illustrated, the second interlayer dielectric layer 224 may include a plurality of metal lines and a plurality of plugs therein. The second interlayer dielectric layer 224 positioned between the third and fourth bonding pads 220 and 222, for example, between a sidewall of the third bonding pad 220 and a sidewall of the fourth bonding pad 222, which face each other, may serve as the dielectric layer of the charge storage element 310.

The charge storage element 310 formed in the second substrate 200 may include the third and fourth bonding pads 220 and 222 respectively corresponding to the first and second electrodes 311 and 312. The third bonding pad 220 may be connected to the first bonding pad 117 formed in the first substrate 100. Thus, the third bonding pad 220 may electrically connect the second transistor Tr2 formed in the first substrate 100 to the third transistor Tr3 formed in the second substrate 200, and simultaneously serve as the first electrode 311 of the charge storage element 310. The fourth bonding pad 222 may be positioned at the same level as the third bonding pad 220 in the vertical direction. The surface of the third bonding pad 220, the surface of the fourth bonding pad 222, and the surface of the second interlayer dielectric layer 224 positioned between the third and fourth bonding pads 220 and 222 may be positioned at the same level in the vertical direction. The fourth bonding pad 222 may be connected to the second bonding pad 119 formed in the first substrate 100, and serve as the second electrode 312 of the charge storage element 310 with the second bonding pad 119. The fourth bonding pad 222 may be connected to the ninth impurity region 214 through the fourth plug 218, thereby having the ground potential. As such, the charge storage element 310 may be formed in the second substrate 200 using capacitance generated between the third bonding pad 220 and the fourth bonding pad 222 positioned adjacent to the third bonding pad 220 in the horizontal direction. Thus, the capacitance of the charge storage element 310 can be controlled depending on the area where the sidewall of the third bonding pad 220 and the sidewall of the fourth bonding pad 222 face each other. Therefore, the charge storage element 310 in the present embodiment can easily provide sufficient capacitance required for the global shutter function. The third and fourth bonding pads 220 and 222 may have various planar shapes which will be described later with reference to FIGS. 3A to 3C.

In the stack-type image sensor according to the first embodiment, the charge storage element 310 may be formed over the bonding surface 300 between the first and second substrates 100 and 200 and use capacitance generated from the sidewalls of the bonding pads 117, 119, 220, and 222 positioned adjacent to each other in the horizontal direction the sidewalls facing each other. The first and third bonding pads 117 and 220 may have the same planar shape. The second and fourth bonding pads 119 and 222 may have the same planar shape or different planar shapes. The planar shapes of the first to fourth bonding pads 117, 119, 220 and 222 may be set depending on the capacitance required by the charge storage element 310.

As described above, the stack-type image sensor according to the first embodiment may include the charge storage element 310 for the global shutter function, which is implemented with the bonding pads 117, 119, 220, and 222 that are formed in the stack-type image sensor. Thus, the charge storage element 310 for the global shutter function can be provided without increasing the area. Furthermore, the area where the sidewalls of the adjacent bonding pads face each other can be adjusted to provide the charge storage element 310 having sufficient capacitance, which is required for the global shutter function.

Hereafter, the planar shapes of the first and second electrodes 311 and 312 constituting the charge storage element 310, that is, the bonding pads 117, 119, 220, and 222 in the stack-type image sensor according to the first embodiment, will be described with reference to FIGS. 3A to 3C.

Figure 3A:
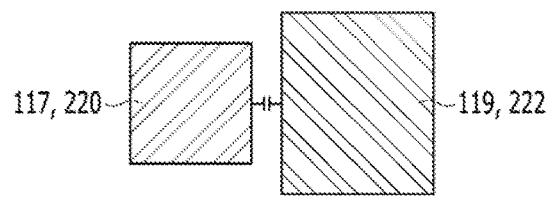
FIGS. 3A to 3C are plan views illustrating first and second electrodes of a charge storage element of FIG. 2.
Figure 3B:
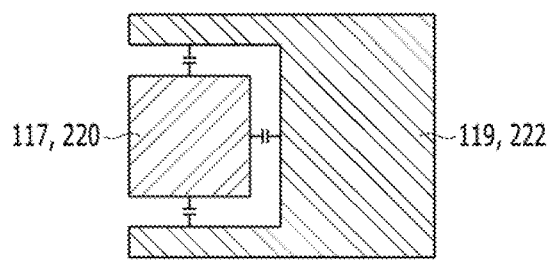
Figure 3C:
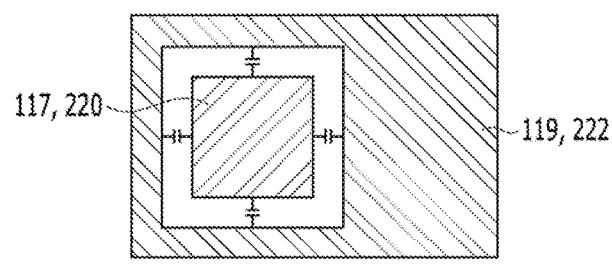

FIGS. 3A to 3C are plan views illustrating the first and second electrodes 311 and 312 (see FIG. 2) of the charge storage element 310 (see FIG. 2) according to the first embodiment.

As illustrated in FIG. 3A, the first and second electrodes 311 and 312 of the charge storage element 310, that is, the first to fourth bonding pads 117 119, 220, and 222 in the stack-type image sensor according to the first embodiment, may have rectangular planar shapes. Thus, any one of the first and second electrodes 311 and 312 may have one sidewall facing the other one. That is any one of the first and second bonding pads 117 and 119 may have one sidewall facing the other one, and any one of the third and fourth bonding pads 220 and 222 may have one sidewall facing the other one.

As illustrated in FIG. 36, the first electrode 311 of the charge storage element 310, that is, the first and third bonding pads 117 and 220 in the stack-type image sensor according to the first embodiment, may have a rectangular planar shape. The second electrode 312 of the charge storage element 310, that is, the second and fourth bonding pads 119 and 222, may partially surround the first electrode 311 of the charge storage element 310. For example, the second and fourth bonding pads 119 and 222 may have three sidewalls facing the first and third bonding pads 117 and 220, respectively. In this case, the capacitance can be increased more than in the structure illustrated in FIG. 3A.

The first and second bonding pads 117 and 119 formed in the first substrate 100 may have the shape illustrated in FIG. 3A, and the third and fourth bonding pads 220 and 222 formed in the second substrate 200 may have the shape illustrated in FIG. 38. In this case, the first and third bonding pads 117 and 220 may have the same planar shape, the second and fourth bonding pads 119 and 222 may have different planar shapes, and the level of difficulty can be reduced when the bonding pads are designed.

As illustrated in FIG. 3C, the first electrode 311 of the charge storage element 310, that is, the first and third bonding pads 117 and 220 in the stack-type image sensor in accordance with the first embodiment, may have a rectangular planar shape. The second electrode 312 of the charge storage element 310 that is, the second and fourth bonding pads 119 and 222, may completely surround the first electrode 311 of the charge storage element 310. For example, the second and fourth bonding pads 119 and 222 may have four sidewalls facing the first and third bonding pads 117 and 220, respectively. In this case, the capacitance can be increased more than in the structures illustrated in FIGS. 3A and 3B.

The first and second bonding pads 117 and 119 formed in the first substrate 100 may have the shape illustrated in FIG. 3A or 3B, and the third and fourth bonding pads 220 and 222 formed in the second substrate 200 may have the shape illustrated in FIG. 3C. In this case, the first and third bonding pads 117 and 220 may have the same planar shape, the second and fourth bonding pads 119 and 222 may have different planar shapes, and the level of difficulty can be reduced when the bonding pads are designed.

In the stack-type image sensor according to the first embodiment, the first and second electrodes 311 and 312 constituting the charge storage element 310, that is, the bonding pads 117, 119, 220, and 222, may have various planar shapes, and the capacitance of the charge storage element 310 can be controlled through the various planar shapes. Furthermore, the bonding pads 117 and 119 formed in the first substrate 100 and the bonding pads 220 and 222 formed in the second substrate 200 may have the same planar shape or different planar shapes. Thus, the level of difficulty can be reduced when the bonding pads 117, 119, 220 and 222 constituting the charge storage element 310 are designed.

Hereafter stack-type image sensors according to second to fourth embodiments, which include charge storage elements having different structures from that of the stack-type image sensor in the first embodiment, will be simply described with reference to the drawings. For convenience of description, the same reference numerals as those of the stack-type image sensor according to the first embodiment will be used. Furthermore, the following descriptions will be focused on the components related to the charge storage element. Therefore, the descriptions of components other than the components related to the charge storage element are omitted herein.

Figure 4:
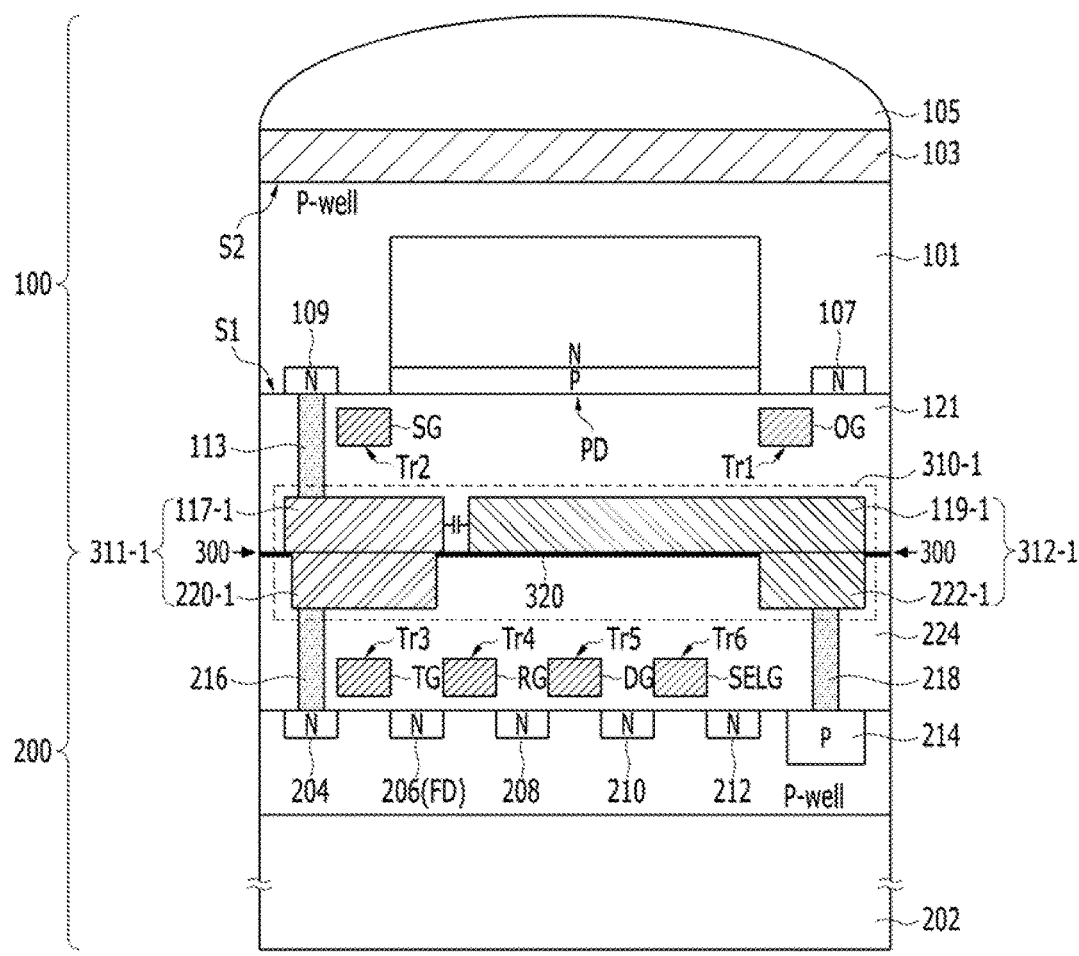
FIG. 4 is a cross-sectional view illustrating the unit pixel of the stack-type image sensor of FIG. 1 according to a second embodiment of the present invention.
Figure 5:
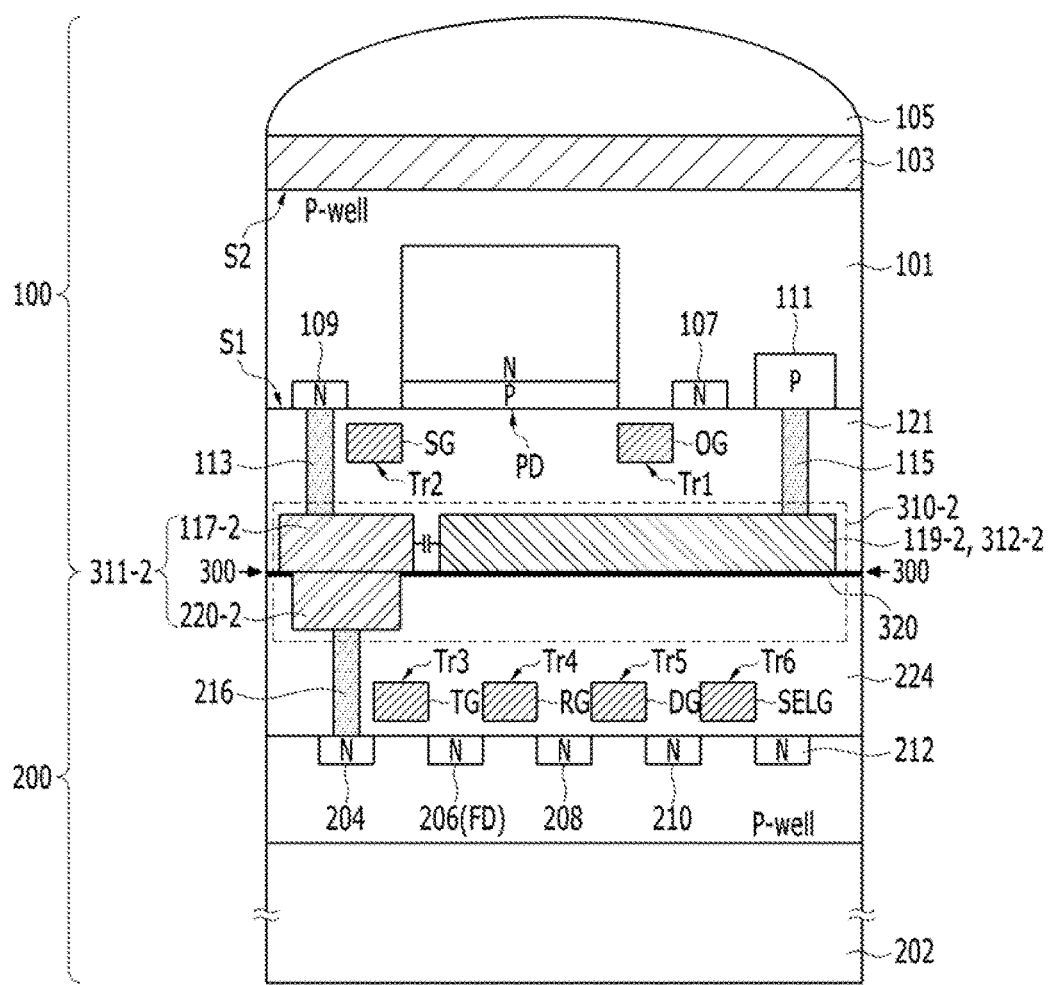
FIG. 5 is a cross-sectional view illustrating the unit pixel of the stack-type image sensor of FIG. 1, according to a third embodiment of the present invention.
Figure 6:
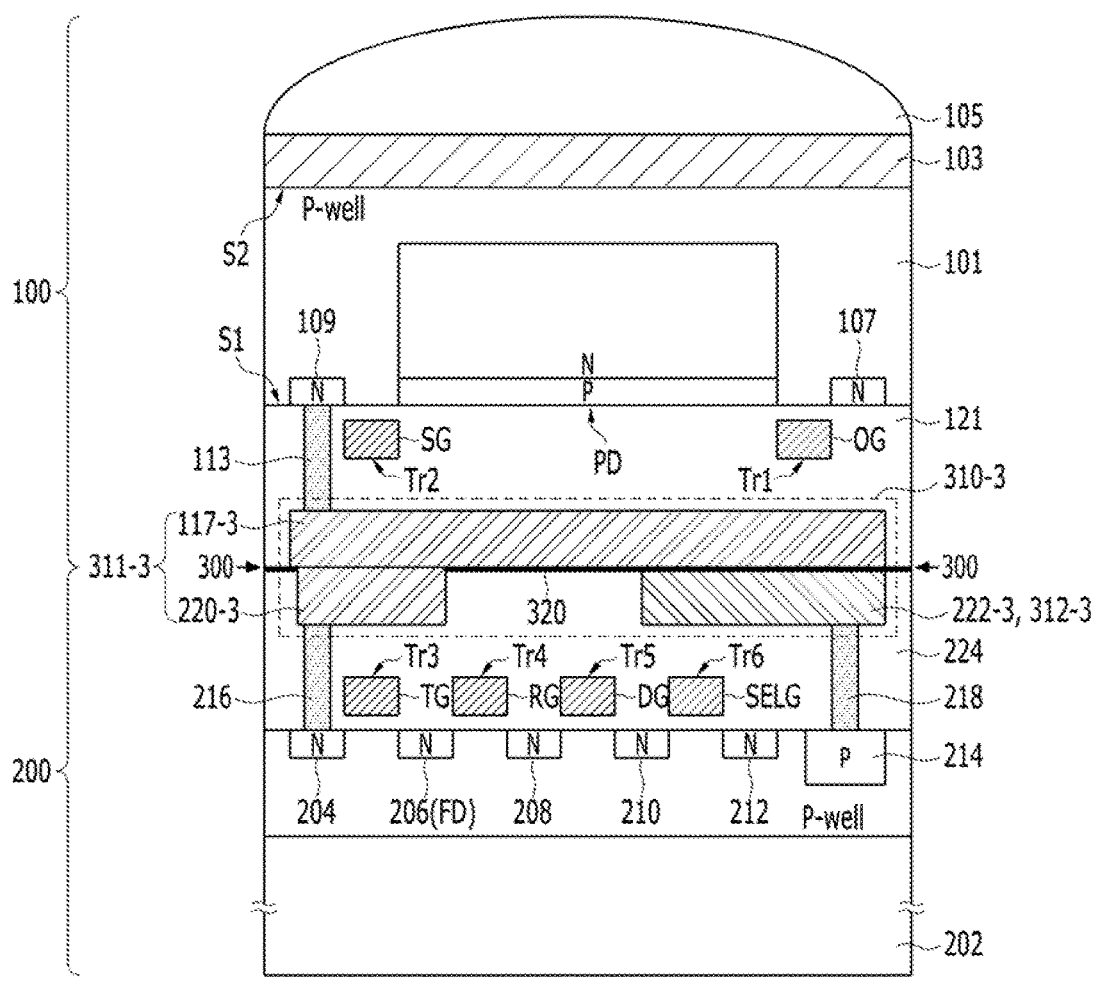
FIG. 6 is a cross-sectional view illustrating the unit pixel of the stack-type image sensor of FIG. 1, according to a fourth embodiment of the present invention.

FIG. 4 is a cross-sectional view illustrating the unit pixel of the stack-type image sensor of FIG. 1, according to a second embodiment of the present invention. FIG. 5 is a cross-sectional view illustrating the unit pixel of the stack-type image sensor of FIG. 1, according to a third embodiment of the present invention. FIG. 6 is a cross-sectional view illustrating the unit pixel of the stack-type image sensor of FIG. 1, according to a fourth embodiment of the present invention.

As illustrated in FIGS. 1, 2 and 4, a charge storage element 310-1 in the stack-type image sensor according to the second embodiment may include first and second bonding pads 117-1 and 119-1 formed in the first substrate 100 and third and fourth bonding pads 220-1 and 222-1 formed in the second substrate 200.

In the second embodiment, the first to third bonding pads 117-1 to 220-1 may have the same shape as those of the first embodiment. In the first embodiment, it was described that the second bonding pad 119 may be connected to the third impurity region 111 formed in the first semiconductor substrate 101 and thus have the ground potential. In the second embodiment, however, the second bonding pad 119-1 may have the ground potential through the fourth bonding pad 222-1. Thus, since the stack-type image sensor according to the second embodiment does not need the third impurity region 111 formed in the first semiconductor substrate 101 in order to provide the ground potential to the second bonding pad 119-1, the light receiving area of the photoelectric conversion element PD can be relatively increased.

In the second embodiment, the fourth bonding pad 222-1, which is in contact with the second bonding pad 119-1, may serve to provide the ground potential to the second electrode 312-1 of the charge storage element 310-1. That is, the fourth bonding pad 222-1 may be positioned so as not to be adjacent to the third bonding pad 220-1. The charge storage element 310-1 in the stack-type image sensor according to the second embodiment may include the first and third bonding pads 117-1 and 220-1 as a first electrode 311-1, the second and fourth bonding pads 119-1 and 222-1 as a second electrode 312-1, and the first interlayer dielectric layer 121 positioned between the first and second bonding pads 117-1 and 119-1, for example, between a sidewall of the first bonding pad 117-1 and a sidewall of the second bonding pad 119-1 that face each other, as a dielectric layer.

As illustrated in FIGS. 1, 2, and 5, a charge storage element 310-2 in the stack-type image sensor according to the third embodiment may include first and second bonding pads 117-2 and 119-2 formed in the first substrate 100 and a third bonding pad 220-2 formed in the second substrate 200.

In the third embodiment, the first to third bonding pads 117-2, 119-2, and 220-2 may have the same shape as those of the first embodiment. However, the second electrode 312-2 of the charge storage element 310-2 may not include the fourth bonding pad 222. That is, the second electrode 312-2 of the charge storage element 310-2 may include only a bonding pad, which is formed in any one of the first and second substrates 100 and 200. The charge storage element 310-2 in the stack-type image sensor according to the third embodiment may include the first and third bonding pads 117-2 and 220-2 as a first electrode 311-2, the second bonding pad 119-2 as a second electrode 312-2, and the first interlayer dielectric layer 121 positioned between the first and second bonding pads 117-1 and 119-1 as a dielectric layer.

As illustrated in FIGS. 1, 2, and 6, a charge storage element 310-3 in the stack-type image sensor according to the fourth embodiment may include a first bonding pad 117-3 formed in the first substrate 100 and third and fourth bonding pads 220-3 and 222-3 formed in the second substrate 200. The first and third bonding pads 117-3 and 220-3 may be electrically connected through the bonding insulating layer 320, and the first and fourth bonding pads 117-3 and 222-3 may be separated by the bonding insulating layer 320. That is, the bonding insulating layer 320 may be positioned between the first and fourth bonding pads 117-3 and 222-3. In other words, the charge storage element 310-3 in the stack-type image sensor according to the fourth embodiment may use the bonding insulating layer 320 as a dielectric layer. Also, the charge storage element 310-3 may use the first and third bonding pads 117-3 and 220-3 as a first electrode 311-3 and use the fourth bonding pad 222-3 as a second electrode 312-3.

The image sensor according to the above-described embodiments may be used in various electronic devices or systems. Hereafter, a case in which the image sensor according to the embodiments is applied to a camera will be described with reference to FIG. 7.

Figure 7:
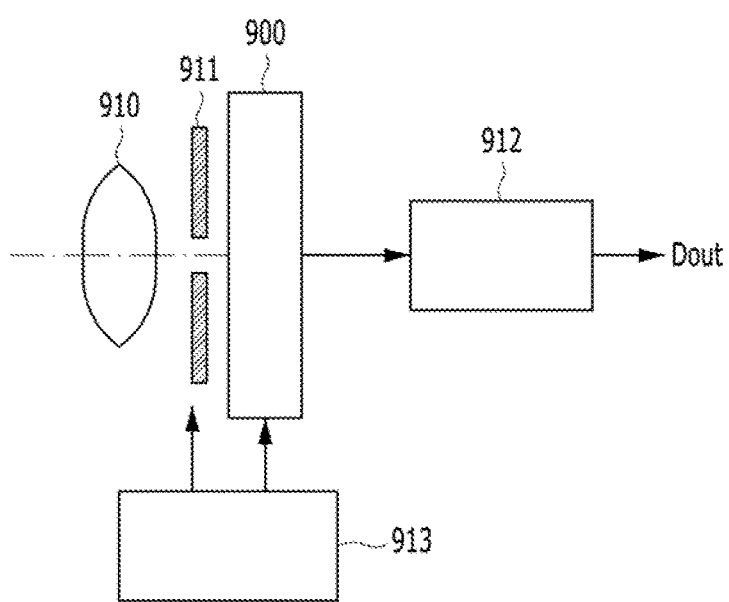
FIG. 7 is a diagram schematically illustrating an electronic device including an image sensor, according to an embodiment of the present invention.

FIG. 7 is a diagram schematically illustrating an electronic device including an image sensor 900, according to an embodiment of the present invention.

Referring to FIG. 7, the electronic device including the image sensor may be a camera capable of taking a still image or a moving picture. The electronic device may include an optical system (or optical lens) 910, a shutter unit 911, the image sensor 900, a driving unit 913 for controlling/driving the image sensor 900 and the shutter unit 911, and a signal processing unit 912.

The optical system 910 guides image light (incident light) from an object, to a pixel array of the image sensor 900. The optical system 910 may be constructed by a plurality of optical lenses. The shutter unit 911 controls a light irradiation period and a light shielding period for the image sensor 900. The driving unit 913 controls the transmission operation of the image sensor 900 and the shutter operation of the shutter unit 911. The signal processing unit 912 performs various kinds of signal processing for the signal outputted from the image sensor 900. An image signal Dout after signal processing may be stored in a storage medium such as a memory or be outputted to a monitor or the like.

According to the present embodiments, since the charge storage element for the global shutter function is implemented with the bonding pads, the charge storage element can be provided without increasing the area. Furthermore, sufficient capacitance required for the global shutter function can be provided.

Although various embodiments have been described for illustrative purposes, it will be apparent to those skilled in the art that various changes and modifications may be made without departing from the spirit and scope of the invention as defined in the following claims.

What is claimed is:
1. A stack-type image sensor, comprising:
a first substrate comprising a photoelectric conversion element and a storage transistor connecting the photoelectric conversion element to a charge storage element; and a second substrate comprising a transfer transistor connecting the charge storage element to a floating diffusion,
wherein the first substrate and the second substrate are stacked,
wherein the charge storage element comprises:
a first electrode and a second electrode positioned adjacent to the first electrode and having a sidewall facing a sidewall of the first electrode, wherein the first electrodes and the second electrodes comprise at least one bonding pad formed in the first or second substrate; and
a dielectric layer inserted between the sidewall of the first electrode and the sidewall of the second electrode, which face each other.

2. The stack-type image sensor of claim 1, wherein the first electrode is formed in each of the first and second substrates, and comprises bonding pads that are in contact with each other.

3. The stack-type image sensor of claim 2, wherein the bonding pads that are in contact with each other have substantially the same planar shape.

4. The stack-type image sensor of claim 1, wherein the second electrode has a ground potential.

5. The stack-type image sensor of claim 1, wherein the second electrode comprises a bonding pad formed in the first substrate or a bonding pad formed in the second substrate.

6. The stack-type image sensor of claim 1, wherein the second electrode is formed in each of the first and second substrates, and comprises bonding pads that are in contact with each other.

7. The stack-type image sensor of claim 6, wherein the bonding pads that are in contact with each other have different planar shapes.

8. A stack-type image sensor, comprising:
a first substrate including a first semiconductor substrate including a photoelectric conversion element, a first interlayer dielectric layer formed over the first semiconductor substrate, a first bonding pad formed in the first interlayer dielectric layer and connected to the photoelectric conversion element through a storage transistor, and a second bonding pad formed in the first interlayer dielectric layer and positioned adjacent to the first bonding pad; and
a second substrate including a second semiconductor substrate, a second interlayer dielectric layer formed over the second semiconductor substrate, and a third bonding pad formed in the second interlayer dielectric layer and connected to a floating diffusion through a transfer transistor,
wherein the first and second substrates are stacked and bonded to each other such that the first and third bonding pads are in contact with each other.

9. The stack-type image sensor of claim 8, further comprising:
a fourth bonding pad formed in the second interlayer dielectric layer of the second substrate and being in contact with the second bonding pad.

10. The stack-type image sensor of claim 9, wherein the fourth bonding pad is positioned adjacent to the third bonding pad, the third and fourth bonding pads are positioned at the same level in a direction vertical to a stacked structure of the first and second substrates, and the fourth bonding pad has a sidewall facing a sidewall of the third bonding pad in a direction horizontal to the stacked structure of the first and second substrates.

11. The stack-type image sensor of claim 10, wherein the fourth bonding pad surrounds a part of the sidewalls of the third bonding pad, or surrounds the whole sidewalls of the third bonding pad.

12. The stack-type image sensor of claim 10, wherein the second interlayer dielectric layer is inserted between the sidewall of the third bonding pad and the sidewall of the fourth bonding pad, which face each other.

13. The stack-type image sensor of claim 9, wherein the fourth bonding pad has a ground potential.

14. The stack-type image sensor of claim 9, wherein the second and fourth bonding pads have different planar shapes.

15. The stack-type image sensor of claim 8, wherein the first and second bonding pads are positioned at the same level in a direction vertical to a stacked structure of the first and second substrates, and the second bonding pad has a sidewall facing a sidewall of the first bonding pad in a direction horizontal to the stacked structure of the first and second substrates.

16. The stack-type image sensor of claim 8, wherein the first interlayer dielectric layer is inserted between a sidewall of the first bonding pad and a sidewall of the second bonding pad, which face each other.

17. The stack-type image sensor of claim 8, wherein the second bonding pad has a ground potential.

18. The stack-type image sensor of claim 8, wherein the second bonding pad surrounds a part of sidewalls of the first bonding pad, or surrounds the whole sidewalls of the first bonding pad.

19. The stack-type image sensor of claim 8, wherein the first and third bonding pads have the same planar shape.

20. The stack-type image sensor of claim 8, further comprising:
a bonding insulating layer formed over a bonding surface between the first and second substrates,
wherein the first and third bonding pads are electrically connected through the bonding insulating layer.

* * * * *